(12) United States Patent
David et al.

(10) Patent No.: US 7,582,910 B2
(45) Date of Patent: Sep. 1, 2009

(54) HIGH EFFICIENCY LIGHT EMITTING DIODE (LED) WITH OPTIMIZED PHOTONIC CRYSTAL EXTRACTOR

(75) Inventors: Aurelien J. F. David, Paris (FR); Claude C. A. Weisbuch, Paris (FR); Steven P. DenBaars, Goleta, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 11/067,956

(22) Filed: Feb. 28, 2005

(65) Prior Publication Data

US 2006/0192217 A1    Aug. 31, 2006

(51) Int. Cl.
- *H01L 27/15* (2006.01)
- *H01L 31/12* (2006.01)
- *H01L 33/00* (2006.01)

(52) U.S. Cl. ............... 257/86; 257/94; 257/98; 257/103

(58) Field of Classification Search ............... 257/79, 257/86, 87, 94–99, 103
See application file for complete search history.

(56) References Cited

U.S. PATENT DOCUMENTS

| | | | |
|---|---|---|---|
| 5,226,053 A | 7/1993 | Cho et al. | |
| 5,362,977 A | 11/1994 | Hunt et al. | |
| 5,779,924 A | 7/1998 | Krames et al. | |
| 6,163,038 A | 12/2000 | Chen et al. | |
| 6,416,575 B2 | 7/2002 | Yamada | |
| 6,504,180 B1 | 1/2003 | Heremans et al. | |
| 6,525,464 B1 | 2/2003 | Chin | |
| 6,538,371 B1 | 3/2003 | Duggal et al. | |
| 6,657,236 B1 | 12/2003 | Thibeault et al. | |
| 6,831,302 B2* | 12/2004 | Erchak et al. ............... 257/87 |
| 6,903,379 B2* | 6/2005 | Wang et al. ............... 257/98 |
| 7,037,738 B2 | 5/2006 | Sugiyama et al. ............... 438/29 |
| 7,037,742 B2 | 5/2006 | Slater, Jr. et al. | |
| 7,078,735 B2* | 7/2006 | Shono et al. ............... 257/98 |
| 7,098,589 B2 | 8/2006 | Erchak et al. | |
| 2004/0125839 A1* | 7/2004 | Lee et al. ............... 372/45 |
| 2004/0191938 A1* | 9/2004 | Ueda et al. ............... 438/21 |
| 2004/0264903 A1* | 12/2004 | Dridi et al. ............... 385/129 |
| 2005/0082545 A1 | 4/2005 | Wierer, Jr. | |
| 2005/0205884 A1 | 9/2005 | Kim et al. | |
| 2006/0202226 A1 | 9/2006 | Weisbuch et al. | |

OTHER PUBLICATIONS

H. Benisty et al., "Impact of Planar Microcavity Effects on Light Extraction—Part I: Basic Concepts and Analytical Trends," 1998, IEEE J. Quantum Electron, vol. 34:1612-1631.

(Continued)

*Primary Examiner*—Thien F Tran
(74) *Attorney, Agent, or Firm*—Gates & Cooper LLP

(57) ABSTRACT

A high efficiency, and possibly highly directional, light emitting diode (LED) with an optimized photonic crystal extractor. The LED is comprised of a substrate, a buffer layer grown on the substrate (if needed), an active layer including emitting species, one or more optical confinement layers that tailor the structure of the guided modes in the LED, and one or more diffraction gratings, wherein the diffraction gratings are two-dimensional photonic crystal extractors. The substrate may be removed and metal layers may be deposited on the buffer layer, photonic crystal and active layer, wherein the metal layers may function as a mirror, an electrical contact, and/or an efficient diffraction grating.

14 Claims, 13 Drawing Sheets

OTHER PUBLICATIONS

M. Boroditsky et al., "Light-Emitting Diode Extraction Efficiency," 1997, Proceedings of the SPIE—The International Society for Optical Engineering, SPIE-Int. Soc. Opt. Eng., vol. 3002:119-122.

D. Delbeke et al., "High-Efficiency Semiconductor Resonant-Cavity Light-Emitting Diodes: A Review," 2002, IEEE J. on selected topic in Quantum Electronics, vol. 8(2):189-206.

N. Eriksson, et al., "Highly Directional Grating Outcouplers with Tailorable Radiation Characteristics," 1996, IEEE J. Quantum Electronics, vol. 32, No. 6, 1038-1047.

X. Guo et al., "Phonton Recycling Semiconductor Light Emitting Diode," 1999, IEDM, International Electron Devices Meeting, Technical Digest, IEDM-99, 600-603.

W. Lukosz, "Light emission by multipole sources in thin layers. I. Radiation patterns of electric and magnetic dipoles" 1981, J. Opt. Soc. Am., vol. 71: 744-754.

M. Rattier, et al., "Omnidirectional and compact guided light extraction from Archimedean photonic lattices," 2003, Appl. Phys. Lett., vol. 83, No. 7: 1283-1285.

M. Rattier, et al., "Toward Ultrahigh-Efficiency Aluminum Oxide Microcavity Light- Emitting Diodes: Guided Mode Extraction by Photonic Crystals" 2002, IEEE Sel. Top. Quantum Electronics. vol. 8, No. 2: 238-247.

I. Schnitzer et al., "30% external quantum efficiency from surface textured, thin-film light emitting diodes," 1993, Applied Physics Letters, 63, No. (16) 2174-2176.

T. Suhara, et al, "Broad area and MOPA lasers with integrated grating components for beam shaping and novel functions," 2003, Proc. SPIE vol. 4995, p. 10-21.

\* cited by examiner

US 7,582,910 B2

HIGH EFFICIENCY LIGHT EMITTING DIODE (LED) WITH OPTIMIZED PHOTONIC CRYSTAL EXTRACTOR

CROSS-REFERENCE TO RELATED APPLICATIONS

This application is related to the following co-pending and commonly-assigned applications:

U.S. Utility application Ser. No. 11/067,910, filed on Feb. 28, 2005, by Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE";

U.S. Utility application Ser. No. 11/067,957, filed on Feb. 28, 2005, by Claude C. A. Weisbuch, Aurelien J. F. David, James S. Speck and Steven P. DenBaars, entitled "HORIZONTAL EMITTING, VERTICAL EMITTING, BEAM SHAPED, DISTRIBUTED FEEDBACK (DFB) LASERS BY GROWTH OVER A PATTERNED SUBSTRATE;" and U.S. Utility application Ser. No. 10/938,704, filed Sep. 10, 2004, by Carole Schwach, Claude C. A. Weisbuch, Steven P. DenBaars, Henri Benisty, and Shuji Nakamura, entitled "WHITE, SINGLE OR MULTI-COLOR LIGHT EMITTING DIODES BY RECYCLING GUIDED MODES;"

which applications are incorporated by reference herein.

STATEMENT REGARDING SPONSORED RESEARCH AND DEVELOPMENT

The present invention was made under support from the University of California, Santa Barbara Solid State Lighting and Display Center member companies, including Stanley Electric Co., Ltd., Mitsubishi Chemical Corp., Rohm Co., Ltd., Cree, Inc., Matsushita Electric Works, Matsushita Electric Industrial Co., and Seoul Semiconductor Co., Ltd.

BACKGROUND OF THE INVENTION

1. Field of the Invention

The invention is related to light emitting diodes (LEDs), and more particularly, to a high efficiency LED with an optimized photonic crystal extractor.

2. Description of the Related Art

A light emitting diode (LED) is a semiconductor device that emits light in a stimulated manner when electrically biased in the forward direction. This effect is a form of electroluminescence.

An LED is comprised of a chip of semiconducting material impregnated, or doped, with impurities to create a structure called a pn junction. When biased forwardly, electrons are injected into the junction from the n-region and holes are injected from the p-region. The electrons and holes release energy in the form of photons as they recombine. The wavelength of the light, and therefore its color, depends on the bandgap energy of the materials forming the pn junction.

As semiconductor materials have improved, the efficiency of semiconductor devices has also improved and new wavelength ranges have been used. Gallium nitride (GaN) based light emitters are probably the most promising for a variety of applications. GaN provides efficient illumination in the ultraviolet (UV) to amber spectrum, when alloyed with varying concentrations of indium (In), for example.

Unfortunately, most of the light emitted within a semiconductor LED material is lost due to total internal reflection at the semiconductor-air interface. Typical semiconductor materials have a high index of refraction, and thus, according to Snell's law, most of the light will remain trapped in the materials, thereby degrading efficiency. By choosing a suitable geometry for the LED, a higher extraction efficiency can be achieved.

FIG. 1 is a cross-sectional view of a homogeneous light-emitting material 10 that illustrates that a fraction of the light 12 emitted inside the material 14 is inside the escape cone 16 and can escape the material 10, while a large fraction of the emitted light 18 is trapped and reflected within the material 10. In this situation, the reflected light 18 is referred to as guided light modes, or guided modes, because the light 18 is confined within the device 10 and guided transversely within the material 10. One method for reducing the effects of the total internal reflection is to create light scattering or redistribution through random texturing of the surface of the device, which leads to multiple variable-angle incidence at the semiconductor-air interface of the device. This approach has been shown to improve emission efficiency by 9-30%, as a result of the very high internal efficiency and low internal losses, which allows many passes for light before it escapes from the device.

FIG. 2 is a cross-sectional view of a semiconductor LED 20 that illustrates this concept, wherein the top surface 22 of the LED 20 is textured, the bottom surface 24 of the LED 20 comprises a reflector, the air has a refractive index of n=1, and the semiconductor material of the LED 20 has a refractive index of n=3.5. The textured top surface 22 of the LED 20 is used to randomize light trajectories in a geometrical optics approach.

Another method to reduce the percentage of light trapped is to use a Resonant-Cavity LED (RCLED) or Micro-Cavity LED (MCLED). MCLEDs offer opportunities to create solid-state lighting systems with greater efficiencies than existing systems using "traditional" LEDs. As a result of incorporating a gain medium within a resonant cavity, MCLEDs emit a highly compact and directional light beam. The higher extraction efficiency and greater brightness of these devices are the main advantages of these technologies over conventional LEDs.

Extraction efficiency refers to the ability of the photons generated by a particular system to actually exit the system as "useful" radiation. This higher extraction efficiency is, however, limited to values in the 40% range as the micro-cavity structure also leads to very efficient emission into guided modes and leaky modes. Thus, it would be useful if these guided modes could be extracted.

As noted above, guided modes are modes that are guided in the device plane due to the index difference between the structure layers. Leaky modes are radiated through the layers, towards the air or substrate—for instance through a DBR. Leaky modes are usually lost as they undergo multiple total internal reflection at interfaces, travelling back and forth within the device, until their energy is dissipated by various loss mechanisms (e.g., metal mirror loss, free carrier absorption, re-absorption by the active layer which recycles energy by re-emission, although with some losses, etc.).

FIG. 3 is a cross-sectional view of a semiconductor LED 26 that illustrates radiating, guided and leaky modes, wherein the LED 26 includes a substrate 28, a buffer layer 30, and an active layer 32 including quantum wells (QWs) 34. Part of the emitted light is extracted 36 towards the air and forms radiative modes 36, part of the emitted light leaks 38 through the various layers of the device 26 into the substrate 28 and forms leaky modes 38, and part of the emitted light is reflected 40 in the active layer 32 (or in both the active layer 32 and buffer layer 30) and forms guided modes 40.

To obtain high efficiency LEDs, it is necessary to optimize direct mode emission 36 outside the structure, minimize the leaky mode emission, if such modes are present 38, and, if possible, re-emit the guided mode emission 40. The present invention aims at fulfilling this goal, in structures amenable to easy fabrication.

FIGS. 4A-4B and 5A-5B illustrate the structures (FIGS. 4A and 5A) and simulations (FIGS. 4B and 5B) of microcavity emission, via a bottom metal or distributed Bragg reflector (DBR) mirror, and a single interface with air at the top, in a gallium nitride (GaN) materials system. FIGS. 4B and 5B are angular emission diagrams inside the semiconductor, on a log scale, wherein FIG. 4B shows the emission of the structure of FIG. 4A, and FIG. 5B that of FIG. 5A. For both FIGS. 4B and 5B, the left half of the figure shows the transverse magnetic (TM) emission and its right half shows the transverse electric (TE) polarized emission. Only in-plane monochromatic dipoles are assumed.

In FIG. 4A, the structure includes a metal mirror 41, and an active layer 42 including quantum wells 43, wherein the structure is a $3\lambda/4$ cavity with the quantum wells 43 placed at $\lambda/4$ (44) of the metal mirror 41. In FIG. 4B, arrow 45 shows emission towards the air, while arrow 46 shows emission towards the substrate. Also in FIG. 4B, braces 47 indicate extracted light, and brace 48 indicates guided modes.

In FIG. 5A, the structure includes a buffer layer 49, 7 period DBR mirror 50 and active layer 51 including quantum wells 52, wherein the structure is a $\lambda$ cavity with the quantum wells 52 placed at $\lambda/2$ (53) of the 7 period DBR mirror 50. In FIG. 5B, arrow 54 shows emission towards the air, while arrow 55 shows emission towards the substrate. Also in FIG. 5B, braces 56 indicate extracted light, braces 57 indicate leaky modes, and brace 58 indicates guided modes.

Extraction efficiency from these structures is, respectively, in FIG. 4A, 31% and 24% in air, and in FIG. 5A, 44% and 27% in epoxy.

Difficulties are encountered in most materials systems when attempting to obtain large micro-cavity extraction improvements of LEDs. FIGS. 4B and 5B show the emission diagrams from which is extracted the expected efficiency of optimized GaN micro-cavity LEDs, and illustrate the following issues:

(i) The index contrast for materials epitaxially grown is quite limited, in particular for the very important nitride materials. This is why emission into many leaky modes is seen in the DBR mirror 50 structure of FIG. 5A, which make the DBR mirror 50 structure of FIG. 5A less efficient than the metal mirror 41 of FIG. 4A.

(ii) The displayed efficiencies are only possible because very thin structures were considered, leading to low-order cavities (as described in reference 10 below). It is difficult to obtain such thin active layers. For example, it is usually necessary to grow a thick (several microns) buffer layer of nitride on a substrate before growing good quality material for the active layer. While lifting off the nitride materials (buffer layer and active layer) from the substrate is already a delicate operation, there is, in addition, extreme difficulty in obtaining the thinner layers (i.e., further removing part or all of the buffer layer) bounded by good metal mirrors, which would lead to the excellent performance of the thin metal mirror structure shown in FIG. 4A.

Thus, there is a need in the art for improved LED structures that provide increased light extraction efficiency. In addition, there is a need in the art for improved LED structures that optimize direct emission outside the structure, minimize leaky mode emission, and re-emit guided mode emission. Moreover, there is a need to provide such improved LEDs while retaining a planar structure, in order to render such structures amenable to easy fabrication. The present invention satisfies these needs, and aims especially at the case of LEDs that support numerous guided modes (e.g., LEDs whose thickness can not easily be made thin enough to make them support only one or a few modes). Finally, the present invention can enhance the directionality of light emission, which is a highly desirable property for some applications, such as LCD displays.

SUMMARY OF THE INVENTION

The present invention discloses a high efficiency, and possibly highly directional, light emitting diode (LED) with an optimized photonic crystal extractor. The LED is comprised of a substrate, a buffer layer grown on the substrate (if such a layer is necessary), one or more optical confinement layers, an active layer including emitting species, and one or more diffraction gratings, wherein the diffraction gratings are two-dimensional photonic crystal extractors. The substrate may be removed and metal layers may be deposited on the buffer layer and active layer, wherein the metal layers may function as a mirror, an electrical contact and/or a diffraction grating.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes new LED structures that provide increased light extraction efficiency while retaining a planar structure. The new LED structures provide direct emissions outside the structure and, in addition, convert guided light into extracted light using a diffraction grating. This grating may be placed outside the current-injected region of the active layer, or current may be injected into the grating region. Moreover, the diffraction grating is comprised of an array of holes, which may be pierced into the emitting species of the active layer, or only in other layers of the LED. The diffraction grating is a two-dimensional photonic crystal extractor, and the present invention provides improvements over previous implementations of photonic crystal extractors.

The LED is comprised of a substrate, a buffer layer grown on the substrate (if such a layer is needed), an active layer including emitting species, one or more optical confinement layers that tailor the structure of the guided modes in the LED, and one or more diffraction gratings, wherein the diffraction gratings are two-dimensional photonic crystal extractors. The substrate may be removed and one or more additional layers (such as metal or a DBR) may be deposited one or both sides of the LED, e.g., on the buffer layer, photonic crystal and active layer, wherein the additional layers may function as a mirror, electrical contact, and/or diffraction grating.

In order to efficiently excite modes that will be extracted by the photonic crystal, one or more light confining layers are placed around the active layer. The efficiency of the new LED structure is due to the fact that guided light is only (or mostly) emitted into guided modes that will be interacting with the photonic crystal, so that the many guided modes that are usually lost are diffracted outside the device. This is especially important in the case of an LED that supports numerous guided modes, such as a nitride-materials-based LED (which usually has to be several microns thick due to material growth considerations). The new LED structure retains a planar single layer structure making it easily manufacturable at low cost.

In some configurations, the new LED structure also displays highly directional light emission.

Technical Description

Figure 1:
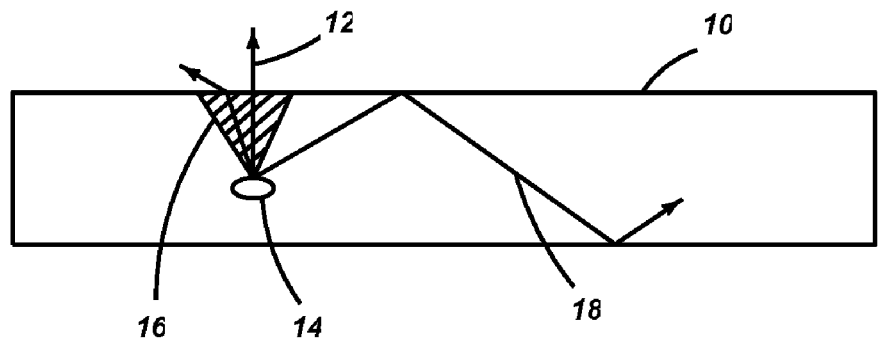
FIG. 1 is a cross-sectional view of a semiconductor light emitting diode (LED)
Figure 2:
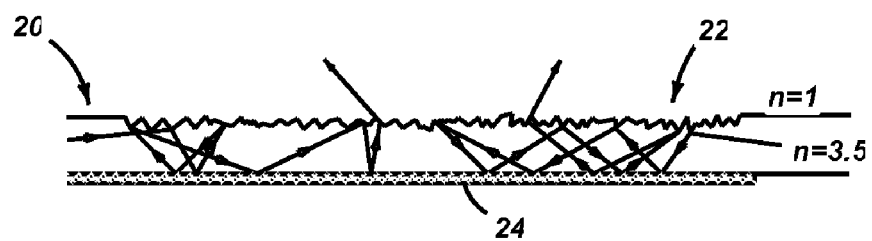
FIG. 2 is a cross-sectional view of a semiconductor light emitting diode (LED)
Figure 3:
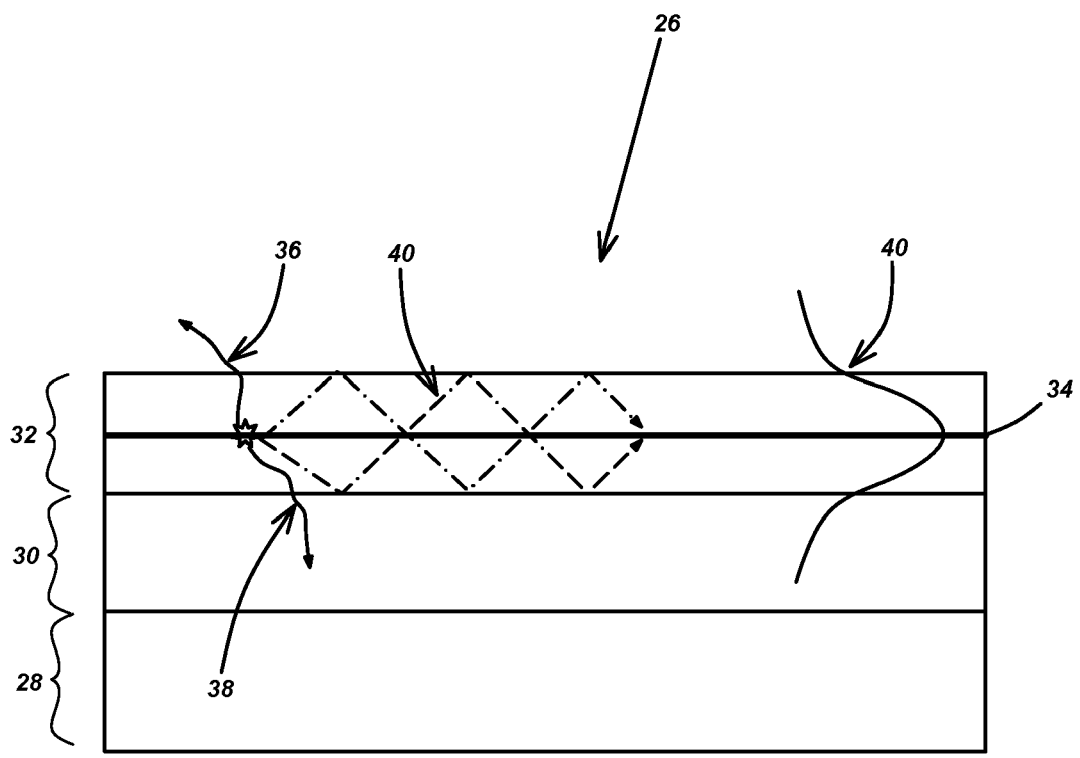
FIG. 3 is a cross-sectional view of a semiconductor light emitting diode (LED)
Figure 4A:
FIGS. 4A-4B and 5A-5B illustrate the structures (FIGS. 4A and 5A) and simulations (FIGS. 4B and 5B) of microcavity emission, via a bottom metal or distributed Bragg reflector (DBR) mirror, and a single interface with air at the top, in a gallium nitride (GaN) materials system.
Figure 4B:
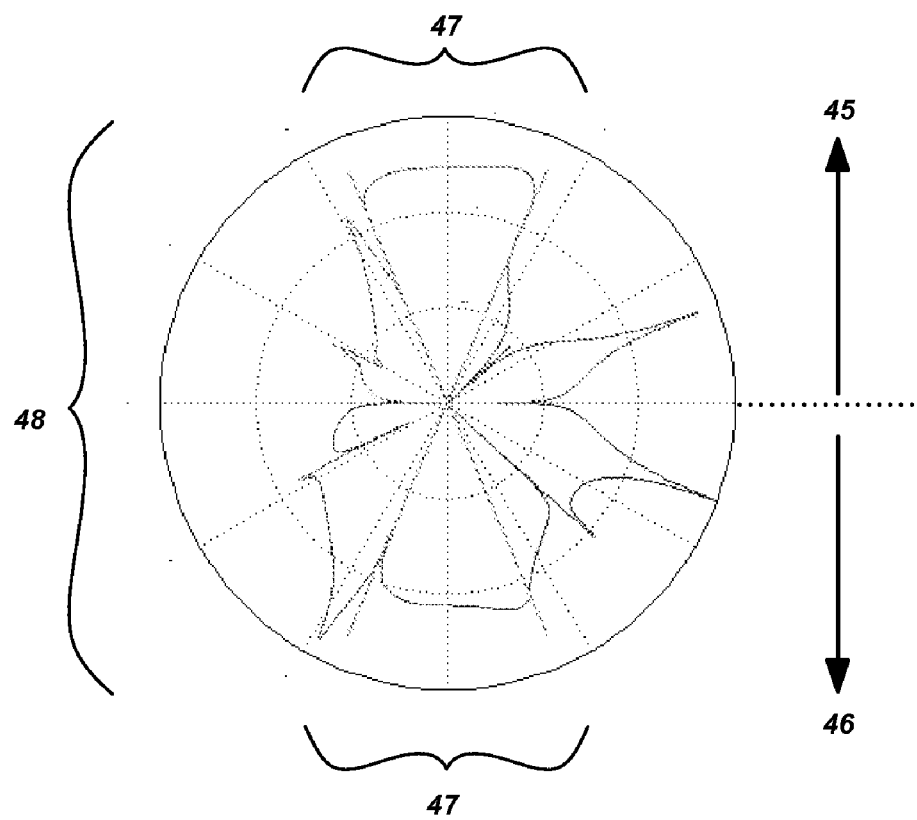
Figure 5A:
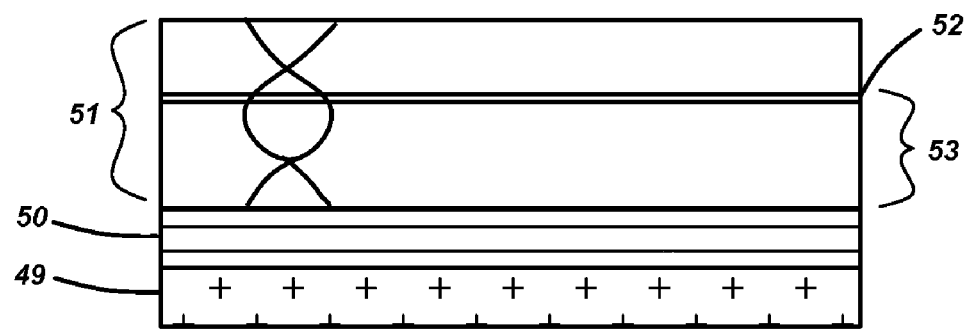
Figure 5B:
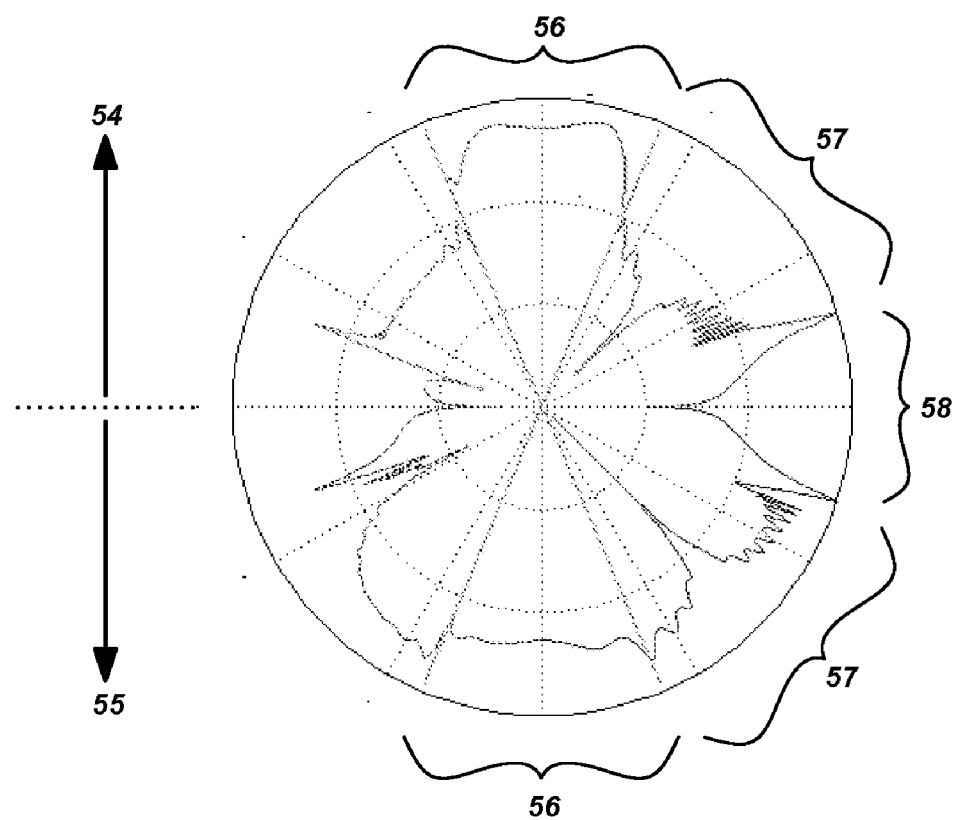
Figure 6:
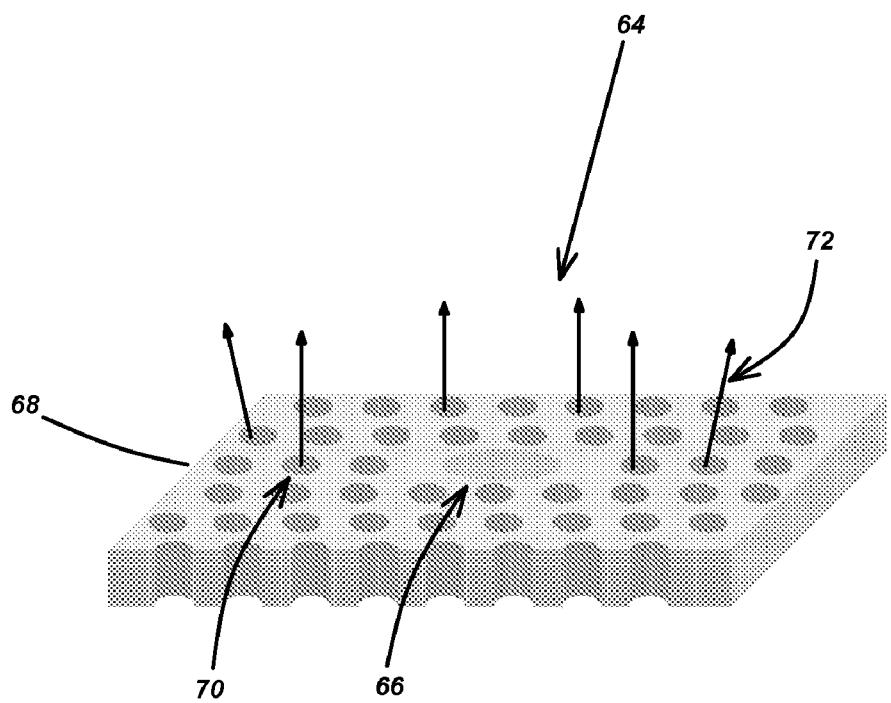
FIGS. 6 and 7 are top plan and cross-section side views, respectively, of a photonic crystal extractor according to a preferred embodiment of the present invention.
Figure 7:
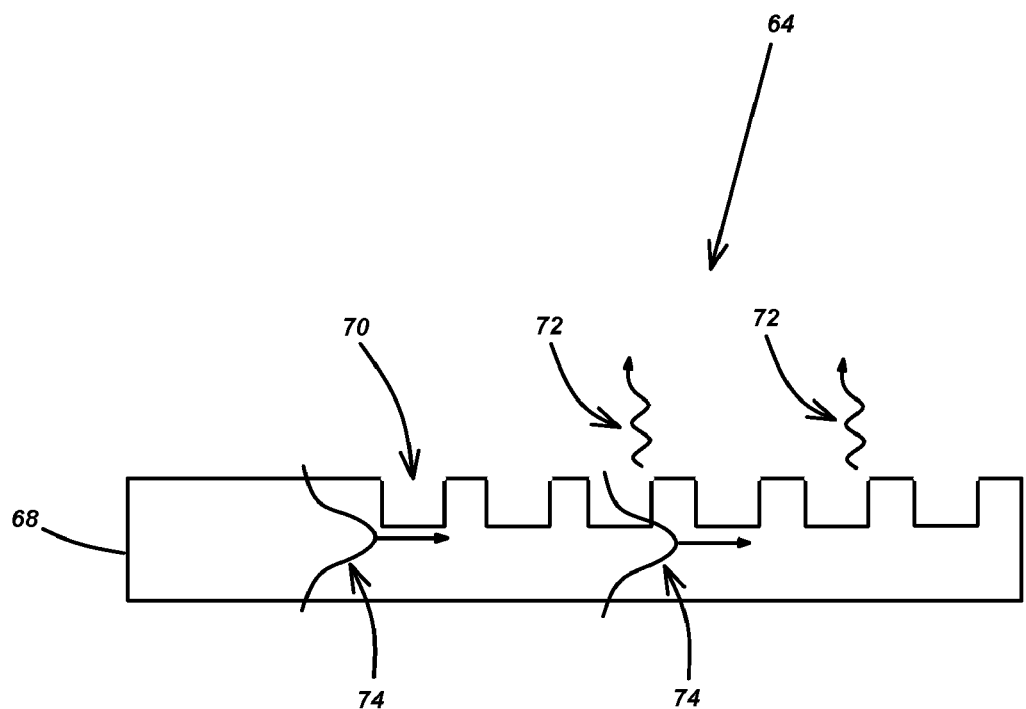

FIGS. 6 and 7 are top plan and cross-section side views, respectively, of a photonic crystal extractor 64, that illustrates the principles of operation for such extractors 64. The photonic crystal extractor 64 includes an active layer or excited region 66 and a 2-dimensional photonic crystal 68 having a plurality of holes 70. In this extractor 64, light extraction 72 of the guided modes 74 is performed by diffraction using the 2-dimensional photonic crystal 68.

The problem usually encountered is that, to obtain good extraction efficiency, it is necessary to use a very thin active layer with good optical confinement, so that only a few modes are excited by the luminescent species in the excited region 66, which are typically semiconductor quantum wells (but may also be other species, such as quantum dots, polymers, metallic clusters, etc.) and then the light is primarily emitted into modes that interact strongly with the photonic crystal 68, with which they have a good overlap, so that guided modes that are usually lost are diffracted outside the LED. This is particularly difficult to achieve by direct growth in those materials where a thick buffer layer is required to achieve growth of device quality material, such as nitride materials widely used in blue, green and ultraviolet (UV) LEDs.

In that case, several original measures are needed to counter the degraded extraction performance originating in the multimode properties of the optical structure. These measures aim at ensuring that light is preferentially emitted in those modes that are sufficiently extracted by the photonic crystal. Indeed, in a multimode structure, a number of modes (those with a large effective index) usually have little overlap with the photonic crystal, so that they are weakly extracted.

Figure 8:
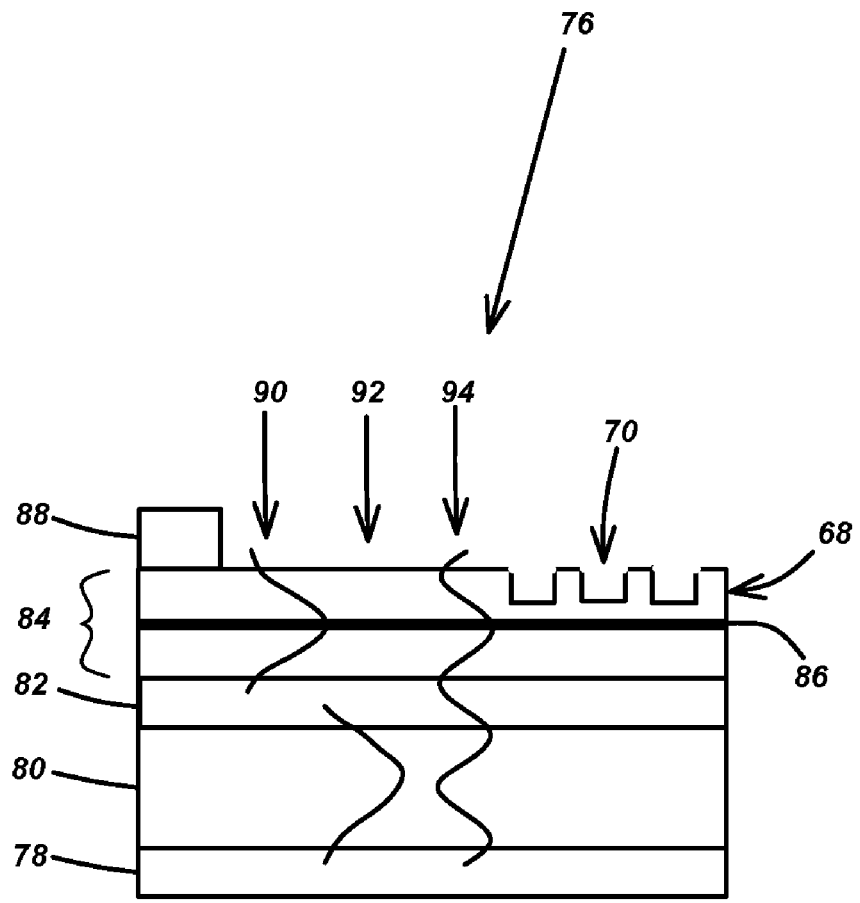
FIG. 8 is a cross-sectional side view that illustrates a structure having an optical confinement layer and current injection outside the photonic crystal region, and illustrates the nature of various supported guided modes, according to a preferred embodiment of the present invention.

FIG. 8 is a cross-sectional side view that illustrates a structure 76 comprised of a substrate 78, a buffer layer 80, an optical confinement layer 82, an active layer 84 including emitting species 86 and a top metallic contact 88, as well as a 2-dimensional photonic crystal 68 having a plurality of holes 70. The structure supports various optical modes 90, 92 and 94, wherein mode 90 comprises a guided mode localized in the active layer 84 region, mode 92 comprises a guided mode localized in the buffer layer 80 region and mode 94 comprises a delocalized guided mode. In this embodiment, the use of the optical confinement layer 82 (e.g., AlGaN in GaN) can help to: (1) only excite those modes principally localized above the optical confinement layer 82 (modes 90 and 94); (2) excite modes not localized fully above the optical confinement layer 82, but still significantly localized above that optical confinement layer 82 (mode 94). Here, the optical confinement layer 82 should have an optical index smaller than that of the material forming the LED. The optical confinement layer 82 may comprise a homogeneous material or a heterostructure (such as a superlattice or even a DBR).

In structures with a substrate 78, some other modes are still guided in the structure between the substrate 78 interface and the optical confinement layer 82, but should be only weakly excited (such as mode 92) as their overlap with the emitting species 86 is small. Thus, they carry a smaller fraction of the emitted light, which is a good thing in view of their much poorer extraction efficiency by the photonic crystal 68.

Typically, the portion of the active layer 84 above the emitting species 86 can be one to a few optical lengths thick (wherein the optical length is the wavelength in the material of the active layer 84) from a waveguide that supports such modes as mode 90 (which means that tunneling of these modes across the layer 82 is weak). The photonic crystal 68 must be close enough to the emitting species 86 (e.g., either the photonic crystals 68 cross the light emitting species 86 in the active layer 84 or the photonic crystals 68 are situated within one or a few optical lengths from the light emitting species 86 in the active layer 84), so that the modes which receive most emitted light are also strongly extracted by the photonic crystal 68.

Depending on the hole 70 pattern and sizes, and also on the use of mirror layers (either metallic or DBR) placed on top or at the bottom of the structure 76, emission can occur to the top or the bottom of the device. Deposition of metal on the photonic crystal 68 may also enhance significantly its diffractive properties with respect to a simple dielectric photonic crystal.

Figure 9:
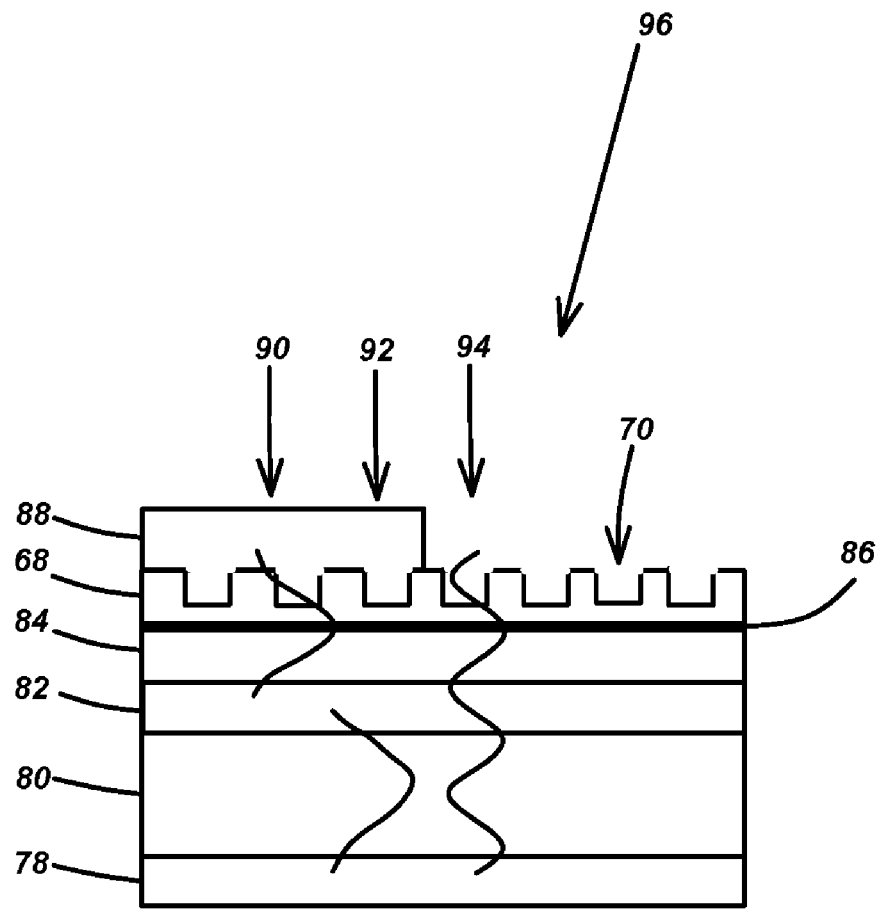
FIG. 9 is a cross-sectional side view that illustrates a structure having an optical confinement layer and current injection inside the photonic crystal region, according to a preferred embodiment of the present invention.

Alternately, the current-injected active layer region 84 may coincide or overlap with the photonic crystal 68 region, as in the structure 96 shown in FIG. 9. This case offers the advantage that a light generation region coincides or overlaps with the photonic crystals 68, so that the guided light is immediately emitted in modes adapted to the photonic crystal 68, and does not suffer from reflexion or scattering at an interface of the photonic crystal 68 region.

Figure 10:
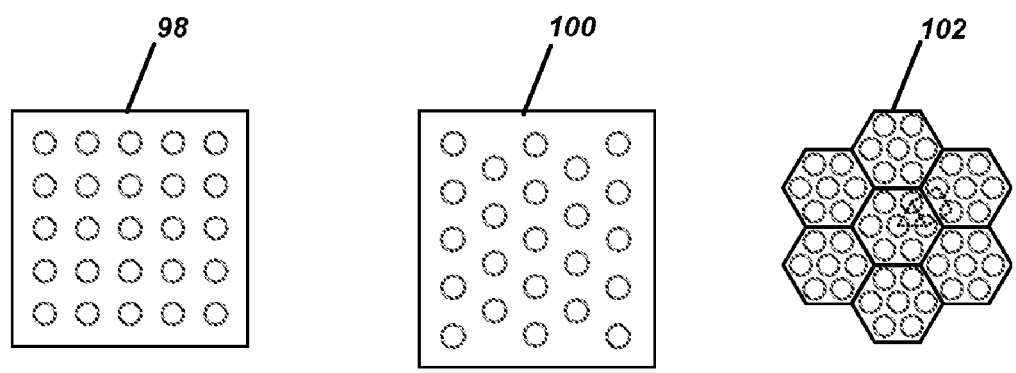
FIG. 10 illustrates various geometries that can be used as for the patterns in the photonic crystal according to a preferred embodiment of the present invention.

Various geometries can be used as for the perforations in the photonic crystal 68. The simplest geometries are square or rectangular arrays, illustrated as 98 and 100, respectively, in FIG. 10. More complex geometries also lead to more efficient light extraction, such as Archimedean tilings, illustrated as 102 in FIG. 10. Finally, even random patterns with a characteristic correlation length in the vicinity of the wavelength can also act as efficient light scatterers. A figure of merit for the grating is that it should diffract light in a large range of incident directions—ideally in all directions. Choice of the photonic crystal lattice can help fulfill this purpose.

Figure 11:
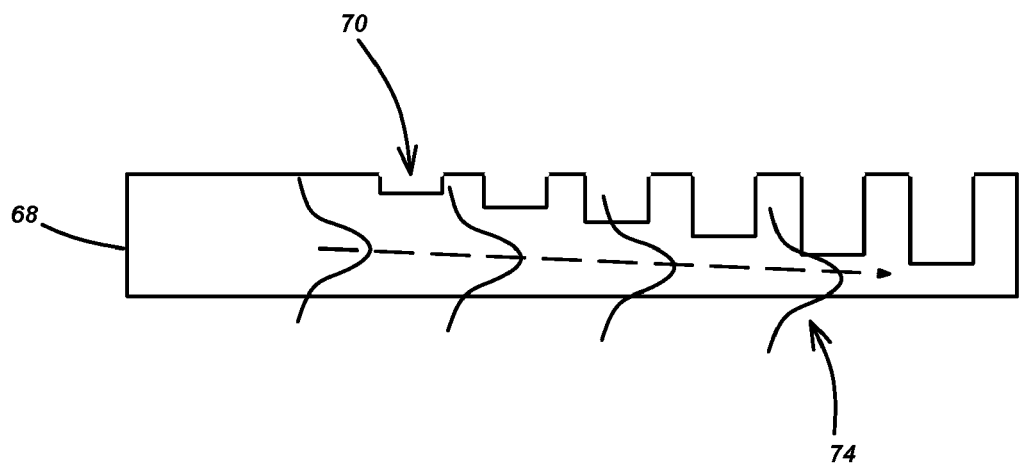
FIG. 11 is a cross-sectional side view of the taper effect comprised of one or more periods of modified holes according to a preferred embodiment of the present invention.

In the case where the current-injected active layer 84 region of the LED is not pierced by the photonic crystal 68, as shown in FIG. 8, it is also desirable to design the photonic crystal 68 extractor to optimally couple the guided light emitted in the excited region to the extracting photonic crystals 68. Light reflection is to be avoided, as light re-entering the non perforated region is prone to be reabsorbed. Thus, the photonic crystals 68 may include a taper comprised of variable hole lines, which can be placed in front of the extracting photonic crystal 68 region to smooth out the transition. The taper may comprise one or more periods of modified holes, wherein the modified holes have a variable hole depth, as shown in the FIG. 11, which is a cross-sectional side view of the taper effect for the guided modes 74 achieved by a progressive increase of hole 70 depths at the beginning of a photonic crystal extractor 68, or a variable hole 70 period, or a variable hole 70 diameter (air filling factor).

Adjusting the parameters of the holes 70 allows the device to emit preferentially towards the top or bottom of the structure, as desired. Additionally, reflectors may be placed on one or more sides of the device, so that the device cannot emit light from that side and to re-direct the light emitted towards a desired direction.

Possible modifications of the present invention include the following:

- The position of the emitting species can be finely tuned inside the structure (on a length scale that is small as compared to the optical length), so as to precisely control its emission properties, such as directionality, spectral lineshape, fraction of light emitted in radiative or guided modes, etc.
- Additional optimization can be achieved as regards electrical injection, for example, by the use of suitable material layers. The present invention describes only the enhancement of optical properties, and does not describe in detail the design required for proper electrical properties.
- The photonic crystal characteristics can be varied along the structure, so as to locally modify the emission properties of the photonic crystals. For example, wavelength and extraction properties can be tailored as desired.
- Additional layers can be added on top of the structure in order to achieve multi color or white light emission, by energy conversion by the fluorophores contained in that layer, as described in cross-referenced applications identified above.
- Several optical confinement layers can be added in order to tailor further the structure of guided modes in the LED. These layers may have an optical index smaller or higher than that of the main material forming the LED. A smaller index may define separate optical regions in the LED, as was illustrated above, while a higher index may modify the emission pattern of the emitting species (as described in Reference 14 identified below).

Figure 12:
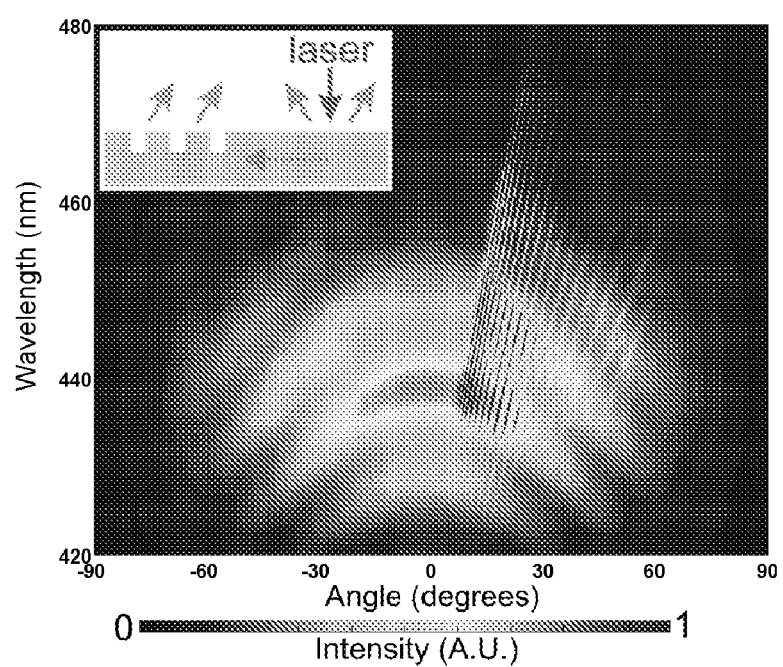
FIG. 12 presents an angular-resolved photoluminescence experiment, which illustrates the band structure of a photonic crystal extractor.
Figure 13:
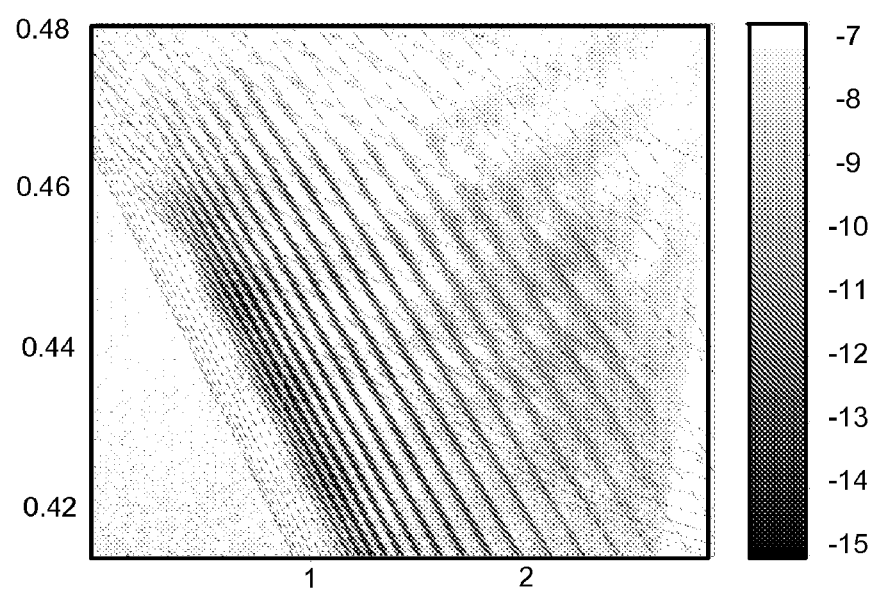
FIG. 13 presents a comparison with a simulation that shows that some of the bands of the photonic crystal are not extracted.

Experimental results are shown in FIGS. 12 and 13. FIG. 12 presents an angular-resolved photoluminescence experiment, which illustrates the band structure of a photonic crystal extractor formed on a waveguide supporting numerous guided modes. FIG. 13 presents a comparison with a simulation (e.g., the dots on FIG. 13), which shows that some of the bands of the photonic crystal are not extracted (they do not appear in the measurement). With the structure suggested by the present invention, little light is emitted in these bands.

As can be seen in FIGS. 12 and 13 from the width of the diffracted lines, diffraction by the photonic crystal is very directional for a given mode and wavelength. Therefore, if the emission lineshape of the emitting species is narrow enough and by suitable tailoring of the guided modes structure, light diffraction by the photonic crystals can occur in a given range of directions, thereby forming a highly directional light source.

Figure 14:
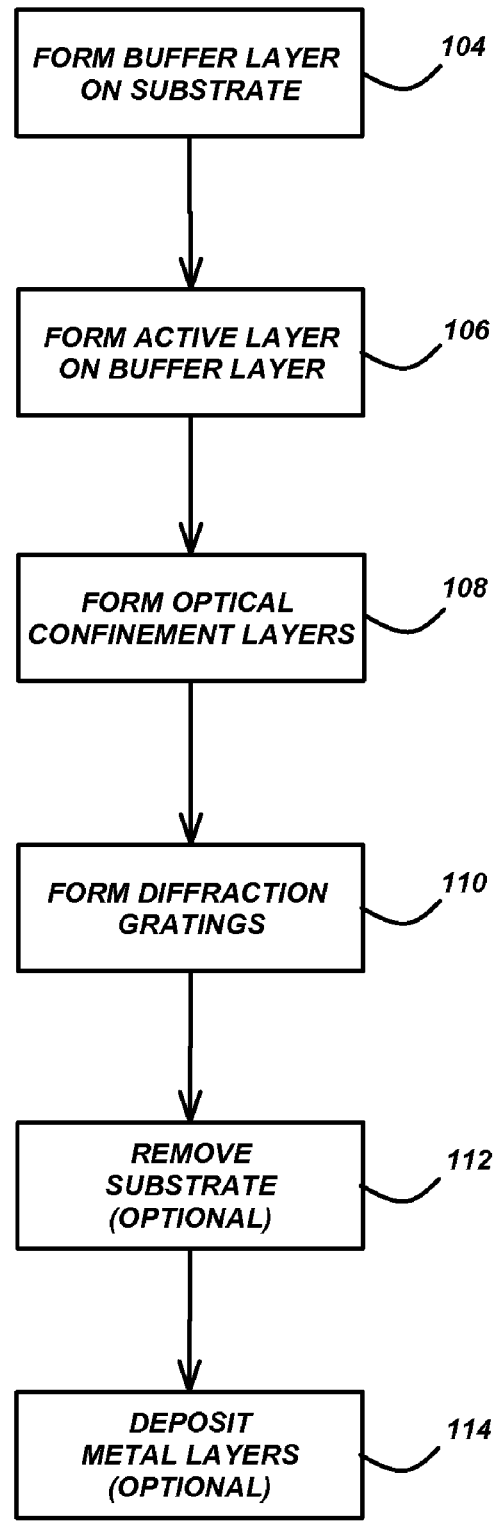
FIG. 14 is a flowchart illustrating the fabrication steps performed according to a preferred embodiment of the present invention.

Finally, FIG. 14 is a flowchart illustrating the fabrication steps performed according to a preferred embodiment of the present invention.

Block 104 represents the step of forming a buffer layer on a substrate.

Block 106 represents the step of forming an active layer on the buffer layer, wherein the active layer includes of one or more light emitting species.

Block 108 represents the step of forming one or more optical confinement layers under or around the active layer, wherein the optical confinement layers tailor a structure of guided modes within the LED.

Block 110 represents the step of forming one or more diffraction gratings on the optical confinement layer, wherein each diffraction grating is a two-dimensional photonic crystal and the diffraction gratings direct emissions outside the LED and convert guided modes into extracted light. The optical confinement layers enhance light extraction by the photonic crystals, and help to excite those modes localized above the optical confinement layers.

Block 112 represents the (optional) step of removing the substrate.

Block 114 represents the (optional) step of depositing metal layers on the buffer layer and/or the active layer, wherein the metal layers may function both as a mirror and/or an electrical contact The end result of these steps is a high efficiency LED with an optimized photonic crystal extractor. The LED retains a planar single layer structure.

REFERENCES

The following references are incorporated by reference herein:

1. U.S. Pat. No. 6,538,371, issued Mar. 25, 2003, to Duggal et al., entitled "White light illumination system with improved color output."

2. U.S. Pat. No. 6,525,464, issued Feb. 25, 2003, to Chin, entitled "Stacked light-mixing LED."

3. U.S. Pat. No. 6,504,180, issued Jan. 7, 2003, to Heremans et al., entitled "Method of manufacturing surface textured high-efficiency radiating devices and devices obtained therefrom."

4. U.S. Pat. No. 6,163,038, issued Dec. 19, 2000, to Chen et al., entitled "White light-emitting diode and method of manufacturing the same."

5. U.S. Pat. No. 5,779,924, issued Jul. 14, 1998, to Krames et al., entitled "Ordered interface texturing for a light emitting device."

6. U.S. Pat. No. 5,362,977, issued Nov. 8, 1994, to Hunt et al., entitled "Single mirror light-emitting diodes with enhanced intensity."

7. U.S. Pat. No. 5,226,053, issued Jul. 6, 1993, to Cho et al., entitled "Light emitting diode."

8. Shnitzer, et al., "30% External Quantum Efficiency From Surface Textured, Thin Film Light Emitting Diode," Applied Physics Letters 63, pp. 2174-2176, 1993.

9. M. Boroditsky, E. Yablonovitch, "Light extraction efficiency from light-emitting diodes," Proceedings of the SPIE—The International Society for Optical Engineering, SPIE-Int. Soc. Opt. Eng., 3002, pp. 119-122, 1997.

10. H. Benisty, H. D. Neve, and C. Weisbuch, "Impact of planar micro-cavity effects on light extraction/Basic concepts and analytical trends," IEEE J. Quantum Electron, vol. 34, p. 1612 (1998).

11. D. Delbeke, R. Bockstaele, P. Bienstman, R. Baets, and H. Benisty, "High-efficiency Semiconductor Resonant-Cavity Light-Emitting diodes: A review," IEEE J. on selected topics in Quantum Electron, vol. 8, no. 2, p. 189, 2002.

12. M. Rattier, H. Benisty, E. Schwoob, C. Weisbuch, T. Krauss, C. J. M. Smith, R. Houdre and U. Oesterle, "Omnidirectional and compact light extraction from Archimedean photonic lattices," Appl. Phys. Lett. 83, 1283, 2003.

13. M. Rattier, H. Benisty, R. Stanley, J. F. Carlin, R. Houdre, U. Oesterle, C. J. M. Smith, C. Weisbuch and T. Krauss, IEEE Sel. Top. Quantum Electr. 8, 238, 2002.

14. W. Lukosz, J. Opt. Soc. Am. 71, 744, 1981.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A light emitting diode (LED), comprising:
   (a) a substrate;
   (b) an active layer formed on the substrate, wherein the active layer includes one or more light emitting species;
   (c) one or more optical confinement layers formed under or around the active layer; and
   (d) one or more diffraction gratings formed on the LED, wherein the diffraction gratings are two-dimensional photonic crystals that direct emissions outside the LED;
   (e) wherein the optical confinement layers are formed to tailor a structure of guided modes within the LED to enhance light extraction by the photonic crystals, by exciting the guided modes localized above the optical confinement layers for extraction by the photonic crystals, and the photonic crystals convert the guided modes into extracted light from the LED.

2. The LED of claim 1, further comprising a buffer layer formed on the substrate, wherein the active layer is formed on the buffer layer.

3. The LED of claim 1, further comprising one or more layers deposited on one or both sides of the LED, wherein the layers function as a mirror, electrical contact, or diffraction grating.

4. The LED of claim 1, wherein light is primarily emitted into modes that interact with the photonic crystals, so that guided modes that are usually lost are diffracted outside the LED.

5. The LED of claim 1, wherein the photonic crystals cross the light emitting species in the active layer.

6. The LED of claim 1, wherein the photonic crystals are situated within one or a few optical lengths from the light emitting species in the active layer.

7. The LED of claim 1, wherein the LED retains a planar single layer structure.

8. The LED of claim 1, wherein the photonic crystals include a taper comprised of variable hole lines.

9. The LED of claim 8, wherein the taper comprises one or more periods of modified holes, and the modified holes have a variable hole depth, variable hole period, or variable hole diameter.

10. The LED of claim 1, wherein characteristics of the photonic crystals are varied along its structure, so as to modify properties of the photonic crystals.

11. The LED of claim 1, wherein a light generation region coincides or overlaps with the photonic crystals, so that guided light does not suffer from reflection or scattering at an interface to the photonic crystals region.

12. The LED of claim 1, wherein a position of the light emitting species is finely tuned, so as to precisely control its emission properties.

13. The LED of claim 1, wherein, by suitable tailoring of a guided modes structure, light diffraction by the photonic crystals occurs in a given range of directions, thereby forming a highly directional light source.

14. A light emitting diode (LED) device, comprising a substrate; an active layer formed on the substrate, wherein the active layer includes one or more light emitting species; one or more optical confinement layers formed under or around the active layer; and one or more diffraction gratings formed on the LED, wherein the diffraction gratings are two-dimensional photonic crystals that direct emissions outside the LED; wherein the optical confinement layers are formed to tailor a structure of guided modes within the LED to enhance light extraction by the photonic crystals, by exciting the guided modes localized above the optical confinement layers for extraction by the photonic crystals, and the photonic crystals convert the guided modes into extracted light from the LED; and wherein the LED device is fabricated according to the following method:
   (a) forming the active layer on a substrate;
   (b) forming the optical confinement layers under or around the active layer; and
   (c) forming the diffraction gratings on LED.

* * * * *